US 8,618,652 B2

(12) United States Patent
Nalla et al.

(10) Patent No.: US 8,618,652 B2
(45) Date of Patent: *Dec. 31, 2013

(54) FORMING FUNCTIONALIZED CARRIER STRUCTURES WITH CORELESS PACKAGES

(75) Inventors: Ravi K Nalla, Chandler, AZ (US); John S Guzek, Chandler, AZ (US); Javier Soto Gonzalez, Chandler, AZ (US); Drew W Delaney, Chandler, AZ (US); Hamid R Azimi, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 457 days.

This patent is subject to a terminal disclaimer.

(21) Appl. No.: 12/761,782

(22) Filed: Apr. 16, 2010

(65) Prior Publication Data

US 2011/0254124 A1 Oct. 20, 2011

(51) Int. Cl.
*H01L 23/053* (2006.01)

(52) U.S. Cl.
USPC 257/700; 257/706; 257/E23.02; 257/E23.023; 438/121; 438/122; 438/123; 438/125

(58) Field of Classification Search
USPC .............. 257/700.758, E23.02, E23.023, 257/E21.505, E21.704, 700, 706, 758; 438/121–127
See application file for complete search history.

(56) References Cited

U.S. PATENT DOCUMENTS

| | | |
|---|---|---|
| 5,353,498 A | 10/1994 | Fillion et al. |
| 5,497,033 A | 3/1996 | Fillion et al. |
| 5,527,741 A | 6/1996 | Cole et al. |
| 5,841,193 A | 11/1998 | Eichelberger |
| 6,154,366 A | 11/2000 | Ma et al. |
| 6,159,767 A | 12/2000 | Eichelberger |
| 6,239,482 B1 | 5/2001 | Fillion et al. |
| 6,242,282 B1 | 6/2001 | Fillion et al. |
| 6,271,469 B1 | 8/2001 | Ma et al. |
| 6,306,680 B1 | 10/2001 | Fillion et al. |
| 6,396,148 B1 | 5/2002 | Eichelberger et al. |
| 6,396,153 B2 | 5/2002 | Fillion et al. |
| 6,423,570 B1 | 7/2002 | Ma et al. |
| 6,426,545 B1 | 7/2002 | Eichelberger et al. |
| 6,489,185 B1 | 12/2002 | Towle et al. |

(Continued)

FOREIGN PATENT DOCUMENTS

| | | |
|---|---|---|
| WO | 2011/130717 A2 | 10/2011 |
| WO | 2011/130717 A3 | 3/2012 |

OTHER PUBLICATIONS

Skeete et al.; "Integrated Circuit Packages Including High Density Bump-Less Build Up Layers and a Lesser Density Core or Coreless Substrate", U.S. Appl. No. 11/860,922, filed Sep. 25, 2007, 19 pages.

(Continued)

*Primary Examiner* — A. Sefer
*Assistant Examiner* — Farid Khan
(74) *Attorney, Agent, or Firm* — Winkle, PLLC

(57) ABSTRACT

Methods of forming a microelectronic packaging structure and associated structures formed thereby are described. Those methods may include attaching a die to a carrier material, wherein the carrier material comprises a top layer and a bottom layer separated by an etch stop layer; forming a dielectric material adjacent the die, forming a coreless substrate by building up layers on the dielectric material, and then removing the top layer carrier material and etch stop layer from the bottom layer carrier material.

15 Claims, 8 Drawing Sheets

(56) References Cited

U.S. PATENT DOCUMENTS

| | | |
|---|---|---|
| 6,555,906 B2 | 4/2003 | Towle et al. |
| 6,555,908 B1 | 4/2003 | Eichelberger et al. |
| 6,580,611 B1 | 6/2003 | Vandentop et al. |
| 6,586,276 B2 | 7/2003 | Towle et al. |
| 6,586,822 B1 | 7/2003 | Vu et al. |
| 6,586,836 B1 | 7/2003 | Ma et al. |
| 6,617,682 B1 | 9/2003 | Ma et al. |
| 6,703,400 B2 | 3/2004 | Johnson et al. |
| 6,706,553 B2 | 3/2004 | Towle et al. |
| 6,709,898 B1 | 3/2004 | Ma et al. |
| 6,713,859 B1 | 3/2004 | Ma |
| 6,734,534 B1 | 5/2004 | Vu et al. |
| 6,794,223 B2 | 9/2004 | Ma et al. |
| 6,818,544 B2 | 11/2004 | Eichelberger et al. |
| 6,825,063 B2 | 11/2004 | Vu et al. |
| 6,841,413 B2 | 1/2005 | Liu et al. |
| 6,888,240 B2 | 5/2005 | Towle et al. |
| 6,894,399 B2 | 5/2005 | Vu et al. |
| 6,902,950 B2 | 6/2005 | Ma et al. |
| 6,964,889 B2 | 11/2005 | Ma et al. |
| 7,067,356 B2 | 6/2006 | Towle et al. |
| 7,071,024 B2 | 7/2006 | Towle et al. |
| 7,078,788 B2 | 7/2006 | Vu et al. |
| 7,109,055 B2 | 9/2006 | McDonald et al. |
| 7,112,467 B2 | 9/2006 | Eichelberger et al. |
| 7,160,755 B2 | 1/2007 | Lo et al. |
| 7,183,658 B2 | 2/2007 | Towle et al. |
| 7,189,596 B1 | 3/2007 | Mu et al. |
| 7,416,918 B2 | 8/2008 | Ma |
| 7,420,273 B2 | 9/2008 | Liu et al. |
| 7,425,464 B2 | 9/2008 | Fay et al. |
| 7,442,581 B2 | 10/2008 | Lytle et al. |
| 7,476,563 B2 | 1/2009 | Mangrum et al. |
| 7,588,951 B2 | 9/2009 | Mangrum et al. |
| 7,595,226 B2 | 9/2009 | Lytle et al. |
| 7,619,901 B2 | 11/2009 | Eichelberger et al. |
| 7,632,715 B2 | 12/2009 | Hess et al. |
| 7,648,858 B2 | 1/2010 | Tang et al. |
| 7,651,889 B2 | 1/2010 | Tang et al. |
| 7,655,502 B2 | 2/2010 | Mangrum et al. |
| 7,659,143 B2 | 2/2010 | Tang et al. |
| 7,723,164 B2 | 5/2010 | Lu et al. |
| 2007/0074900 A1 | 4/2007 | Lee et al. |
| 2007/0246744 A1 | 10/2007 | Chen et al. |
| 2007/0284704 A1 | 12/2007 | Leal et al. |
| 2008/0006936 A1* | 1/2008 | Hsu .................. 257/731 |
| 2008/0054448 A1 | 3/2008 | Lu et al. |
| 2008/0192776 A1 | 8/2008 | Fleming et al. |
| 2008/0315377 A1 | 12/2008 | Eichelberger et al. |
| 2008/0315391 A1 | 12/2008 | Kohl et al. |
| 2009/0007282 A1 | 1/2009 | Tomizuka et al. |
| 2009/0072382 A1 | 3/2009 | Guzek |
| 2009/0079063 A1 | 3/2009 | Chrysler et al. |
| 2009/0079064 A1 | 3/2009 | Tang et al. |
| 2009/0212416 A1 | 8/2009 | Skeete |
| 2009/0236750 A1* | 9/2009 | Chia .................. 257/774 |
| 2009/0246909 A1 | 10/2009 | Takeuchi et al. |
| 2009/0294942 A1 | 12/2009 | Palmer et al. |
| 2010/0044855 A1 | 2/2010 | Eichelberger et al. |
| 2010/0047970 A1 | 2/2010 | Eichelberger et al. |
| 2011/0241186 A1* | 10/2011 | Nalla et al. .................. 257/659 |

OTHER PUBLICATIONS

Nalla et al.; "Microelectronic Package and Method of Manufacturing Same", U.S. Appl. No. 12/590,350, filed Nov. 6, 2009.

Guzek; "Recessed and Embedded Die Coreless Package", U.S. Appl. No. 12/655,321, filed Dec. 29, 2009, 26 pages.

Guzek et al.; "Semiconductor Package With Embedded Die and Its Methods of Fabrication", U.S. Appl. No. 12/655,335, filed Dec. 29, 2009, 36 pages.

Guzek et al.; "Die Stacking Using Through-Silicon Vias on a Bumpless Build-Up Layer Package", Unfiled US Patent Application.

Guzek; "Mold Compounds in Improved Embedded-Die Coreless Substrates, and Processes of Forming Same", U.S. Appl. No. 12/821,847, filed Jun. 23, 2010, 36 pages.

Nalla et al.; "Microelectronic Package and Method of Manufacturing Same", U.S. Appl. No. 12/825,729, filed Sep. 29, 2009, 26 pages.

Nalla et al.; "Forming In-Situ Micro-Feature Structures With Coreless Packages", U.S. Appl. No. 12/755,183, filed Apr. 06, 2010, 21 pages.

Nalla et al.; "Forming Metal Filled Die Back-Side Film for Electromagnetic Interference Shielding With Coreless Packages ", U.S. Appl. No. 12/755,201, filed Apr. 6, 2010, 23 pages.

Guzek et al.; "System-In-Package Using Embedded-Die Coreless Substrates, and Processes of Forming Same", U.S. Appl. No. 12/725,925, filed Mar. 17, 2010, 34 pages.

Guzek et al.; "A Method for Improving the Reliability of an Embedded Die Coreless Package", unfiled US Patent Application.

Sankman et al.; "Embedded Semiconductive Chips in Reconstituted Wafers, and Systems Containing Same", U.S. Appl. No. 12/753,637, filed Apr. 2, 2010, 34 pages.

Nalla et al.; "Inverted Package With Bumpless Build-Up Layer (BBUL) Technology for Low Power Applications", unfiled US Patent Application.

Swaminathan et al.; "Magnetic Microelectronic Device Attachment", U.S. Appl. No. 12/778,335, filed May 12, 2010, 43 pages.

Nalla et al.; "Method for Making Laminated Core Products With Bumpless Build-Up Layer (BBUL) Technology", unfiled US Patent Application.

Malatkar; "Bumpless Build-Up Layer Package Design With an Interposer", U.S. Appl. No. 12/827,323, filed Jun. 30, 2010, 28 pages.

Crawford et al.; "Misalignment Correction for Embedded Microelectronic Die Applications", U.S. Appl. No. 12/830,875, filed Jul. 6, 2010, 41 pages.

Ma et al.; "Direct Build-Up Layer on an Encapsulated Die Package", U.S. Appl. No. 09/640,961, filed Aug. 16, 2000, 70 pages.

Nalla et al.; "Dual Sided Fully Embedded Package Using Bumpless Build-Up Layer (BBUL) Technology", unfiled US Patent Application.

International Search Report and Written opinion received for PCT Patent Application No. PCT/US2011/032794, mailed on Dec. 21, 2011, 9 pages.

International Preliminary Report on Patentability and Written Opinion for PCT/US2011/032794, Mailed on Oct. 26, 2012, 7 pages.

\* cited by examiner

FORMING FUNCTIONALIZED CARRIER STRUCTURES WITH CORELESS PACKAGES

BACKGROUND OF THE INVENTION

As semiconductor technology advances for higher processor performance, advances in packaging architectures may include coreless bumpless build-up Layer (BBUL-C) package architectures and other such assemblies. Current process flows for BBUL-C packages involve building of the substrate on a temporary core/carrier capped with copper foil, which is etched off after the package is separated from the core.

BRIEF DESCRIPTION OF THE DRAWINGS

While the specification concludes with claims particularly pointing out and distinctly claiming certain embodiments of the present invention, the advantages of this invention can be more readily ascertained from the following description of the invention when read in conjunction with the accompanying drawings in which:

DETAILED DESCRIPTION OF THE PRESENT INVENTION

Figure 1A:
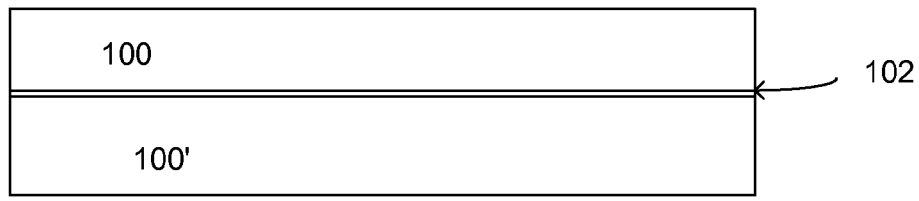
FIGS. 1a-1h represent methods of forming structures according to an embodiment of the present invention.
Figure 1B:
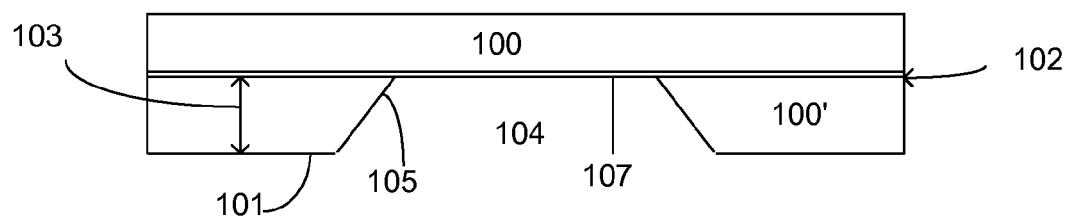

In the following detailed description, reference is made to the accompanying drawings that show, by way of illustration, specific embodiments in which the methods may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled. In the drawings, like numerals refer to the same or similar functionality throughout the several views.

Methods and associated structures of forming and utilizing a microelectronic structure, such as a package structure, are described. Those methods may comprise Those methods may include attaching a die to a carrier material, wherein the carrier material comprises a top layer and a bottom layer separated by an etch stop layer; forming a dielectric material adjacent the die, forming a coreless substrate by building up layers on the dielectric material, and then removing the top layer carrier material and etch stop layer from the bottom layer carrier material. Methods of the embodiments enable the functionalizing of the carrier material to create functionalized carrier structures, such as an EMI shield, a stiffener, a heat spreader, an inductor and PoP land structures, for example.

FIGS. 1a-1h illustrate embodiments of a method of forming a microelectronic structure, such as a package structure, for example. FIG. 1a illustrates a carrier material 100, 100'. In one embodiment, the carrier material 100 may comprise a multi-layer copper foil that may serve as a carrier, such as a microelectronic die carrier. In other embodiments, the carrier material may comprise any suitable conductive carrier material 100. In an embodiment, the carrier material 100 may comprise two layers, a top layer 100 and a bottom layer 100' as shown, but may comprise one layer or greater than two layers in other embodiments.

In an embodiment, the carrier material 100 may comprise two layers of a conductive material, such as but not limited to copper, for example, that may be separated by a thin etching barrier (stop) layer 102. In an embodiment, the etch stop layer 102 may comprise such materials as nickel, for example, but may comprise any such material that may serve to comprise an etch stop layer to facilitate the stopping of an etch between carrier layers. In an embodiment, the etch stop layer 102 may serve to aid in the formation of a cavity 104 (FIG. 1b), especially during an etching process, for example. In an embodiment, a thickness 103 of the bottom carrier material layer 100' may be dictated by the thickness and embedded depth of a die to be embedded into the carrier material 100' in a subsequent assembly step.

The cavity 104 may be formed in one layer of the carrier material, such as by removing a portion of the bottom carrier material layer 100'. The cavity 104 may be formed utilizing any suitable removal process, such as an etching process, such as are known in the art. For example, a masking material may be laminated onto the bottom layer of the carrier material 100' and the carrier material 100' may be patterned to form the cavity 104, wherein a die may be subsequently placed therein. The etch stop layer 102 between the carrier material layers 100, 100' may serve as an etch stop for the cavity 104 formation and may define a flat surface to place the die on to. The cavity 104 as formed may comprise a bottom portion 101 an angled portion 105, and a top portion 107, wherein the top portion comprises a portion of the etch stop layer 102.

Figure 1C:
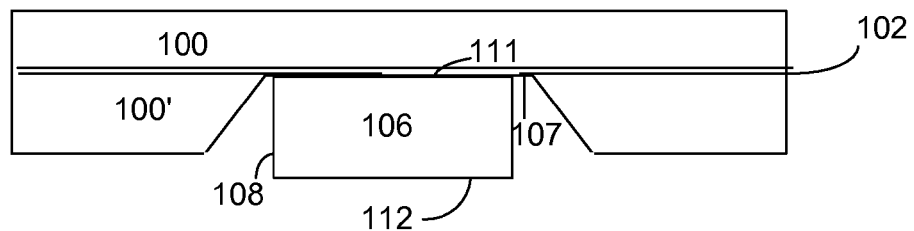

In other embodiments, the cavity 104 may be formed, and the bottom portion of the carrier material 100 may remain substantially flat, as in FIG. 1c. In an embodiment, a die, such as a microelectronic die 106, for example, may be attached within the cavity 104 (FIG. 1c). In an embodiment, the die 106 may comprise a thin die 106, and may comprise a thickness of below about 150 microns. In an embodiment, the die 106 may be attached to the top portion 107 of the cavity 104. In an embodiment, the die 106 may comprise at least one sidewall 108, a back side 111 and an active side 112. In an embodiment, the back side 111 of the die 106 may be disposed directly on a portion of the etch stop layer 102 within the cavity 104. In some cases, an adhesive film (not shown) and/or an attach process may be used to attach the die 106 into the cavity 104 of the carrier material 100'. In an embodiment, the carrier material, such as copper, can be roughened to aid in the attachment of the die 106.

In an embodiment, the adhesive film can be used as a permanent part of a final package to protect the backside 111 of the die 106, to provide a surface for marking, and/or to manage any warpage that may occur within the die 106, for example. In an embodiment, the adhesive may comprise a back-side film (DBF) that may be applied to the back side 111 of the die 106 prior to placement. The DBF may be filled with metallic particles (e.g, copper or silver), for example, to enhance conductivity when subsequently connected to a heat spreader device, such as a micro-channel heat spreader, for example.

Figure 1D:
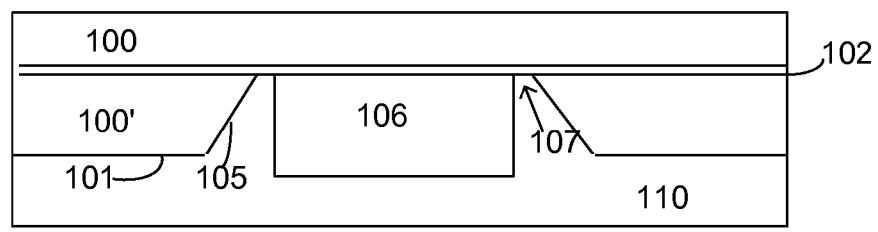

A dielectric material 110 may be formed on the carrier material 100' and adjacent the die 106 that is in the cavity 104 of the carrier material 100' (FIG. 1*d*). In an embodiment, the dielectric material 110 may be formed by a laminating process, for example. The dielectric material 110 may be formed on the bottom portion 101 of the cavity 104, on the angled portion 105 of the cavity 104, and on a portion of the top portion 107 of the cavity 104 of the carrier material 100' that surrounds the die 106. The dielectric material 110 may provide a level plane for a subsequent build-up process. In an embodiment, the carrier material 100' may be roughened prior to lamination to aid with adhesion to the dielectric material 110.

Figure 1E:
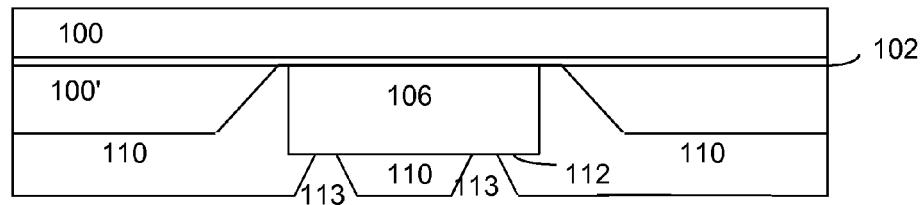
Figure 1F:
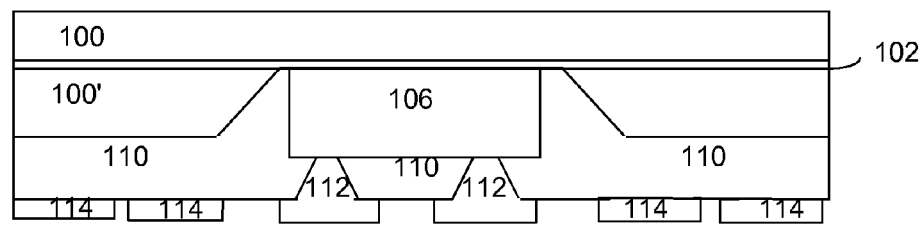
Figure 1G:
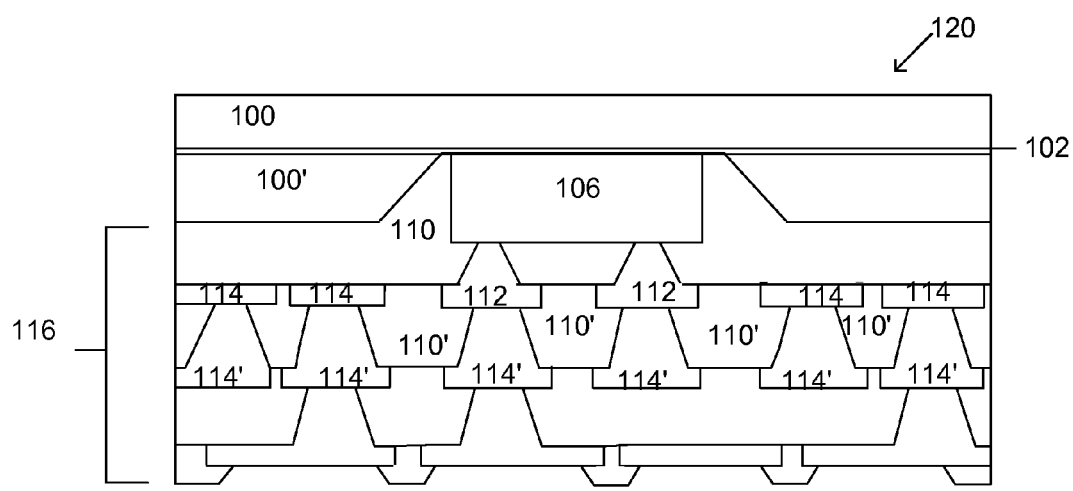

In an embodiment, vias 113 may be formed in the dielectric material 110 in a die area landing of the die 106, wherein die pads, for example copper die pads, may be exposed on the active side 112 of the die 106 (FIG. 1*e*). In an embodiment, a semi-additive process (SAP) may be used to form die pad interconnect structures 112 on die pads of the die 106 and a first metal layer 114 may be formed on the dielectric material 110 adjacent the die 106 (FIG. 1*f*). Subsequent layers may then be formed using standard substrate SAP build-up processing, for example, wherein further dielectric layers 110' and metallization layers 114' may be formed upon each other to form a coreless substrate portion 116 of a coreless package structure 120 by utilizing the buildup process (FIG. 1*g*). In an embodiment, the coreless package structure 120 may comprise a BBUL coreless package structure 120, and the die 106 may be fully embedded in the coreless package 120 where fully embedded refers as process where die 106 is directly attached to the layer 110' without the cavity 104.

Figure 1H:
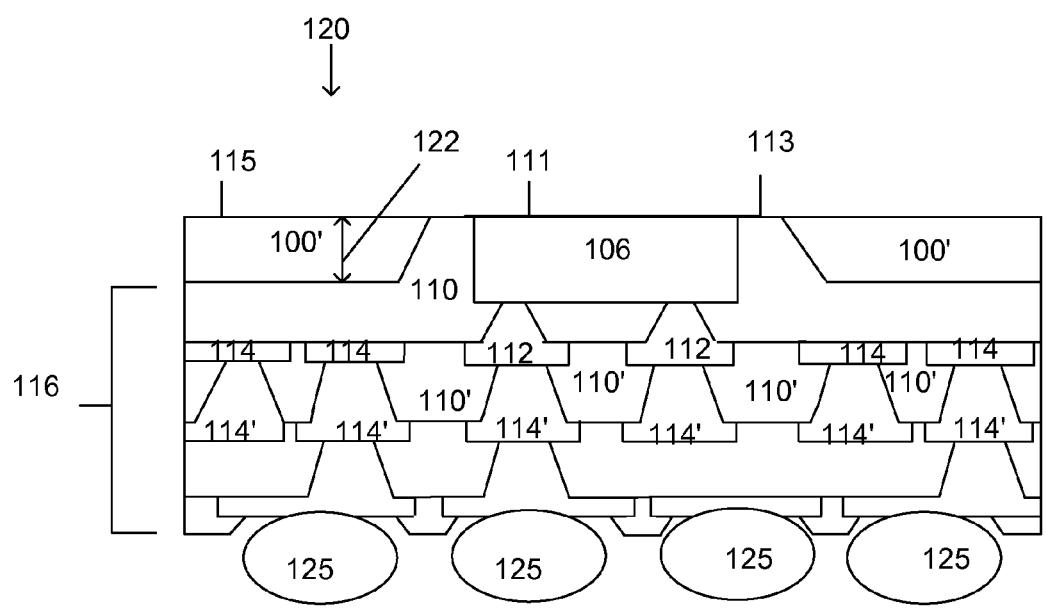

In an embodiment, when the build-up is complete, the top carrier material 100 and the etch stop layer 102 may be removed, exposing the bottom carrier material 100' that is attached to the coreless package structure 120 (FIG. 1*h*). The carrier material 100' may be chemically treated to reduce future oxidation, in some cases. In an embodiment, the bottom carrier material 100' may be patterned to form at least one functionalized carrier structure 100'. In an embodiment, the functionalized carrier structure 100' may be disposed within a depth 122 of the coreless package structure 120. The functionalized carrier material 100' may be formed to serve various functions. For example, the carrier material 100' that is retained on/within the coreless package 120 may function as a stiffener 100', in an embodiment. The coreless substrate portion 116 may be built up directly on the stiffener/functionalized carrier structure 100', without any externally added macroscopic adhesive attachment, in some cases. In an embodiment, the coreless package substrate 120 may further comprise interconnect structures 125, such as ball gird array (BGA) balls, that may be attached to the package structure 120.

In an embodiment, by adjusting the right material properties, the presence of the carrier material 100' (which may comprise a copper ring in some cases) around the die 106 can alleviate the warpage of the coreless package structure 120. In some prior art coreless BBUL package structures, very small form factor (~12×12 mm) products may be employed. Larger form factor products will benefit by the addition of the stiffener 100' to the BBUL package structure 120 without adding additional post-packaging cost, since attachment of a stiffener post-package manufacturing will add cost to the package. Thus, the stiffener of the embodiments herein enable the extension of this technology to more cost sensitive markets/architectures, like chipset, and low-z height mobile CPU's, for example. In other embodiments, the carrier material 100' may be functionalized/formed to serve several additional functions, such as but not limited to the formation of a heat spreader, EMI (electro magnetic interference) shielding, etc. In an embodiment, a top surface 115 of the at least one functionalized carrier structure 100' is coplanar with a top surface 113 of the coreless bumpless buildup package 120 and is coplanar with the backside 111 of the die 106.

Figure 2A:
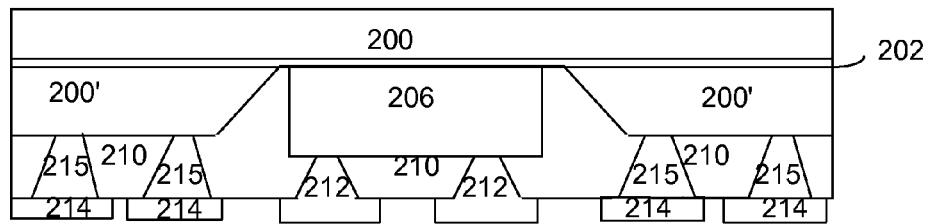
FIGS. 2a-2e represent methods of forming structures according to an embodiment of the present invention.

In another embodiment, a semi-additive process may be used to form die pad interconnect structures 212 on die pads of a die 206 and a first metal layer 214 may be formed on a dielectric material 210 adjacent the die 206 (FIG. 2*a*). Vias 215 may be formed outside the die area (in a non-die area) to connect to a bottom carrier layer 200', wherein an etch stop layer 202 may be disposed on the bottom carrier layer 200', and wherein a top carrier layer 200 may be disposed on the etch stop layer 202 (FIG. 2*a*).

Figure 2B:
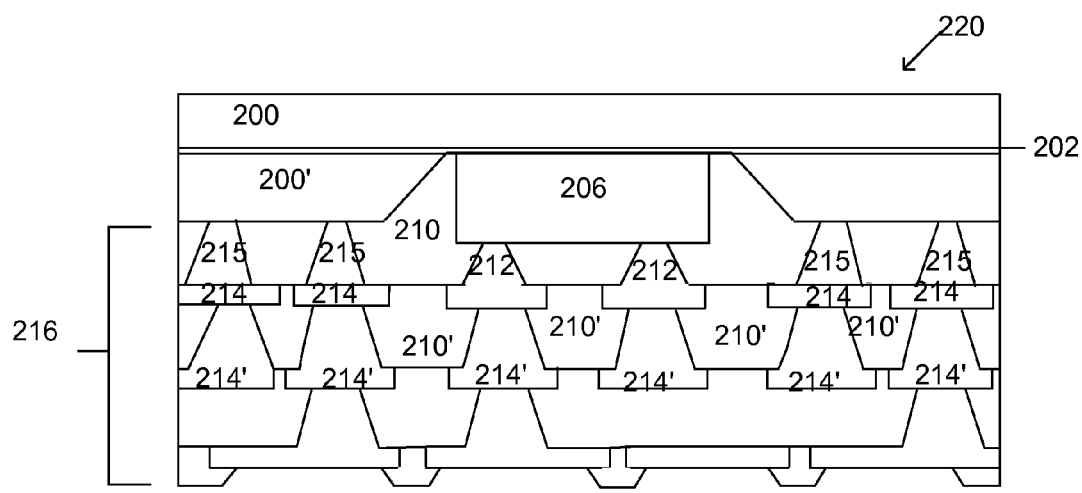
Figure 2C:
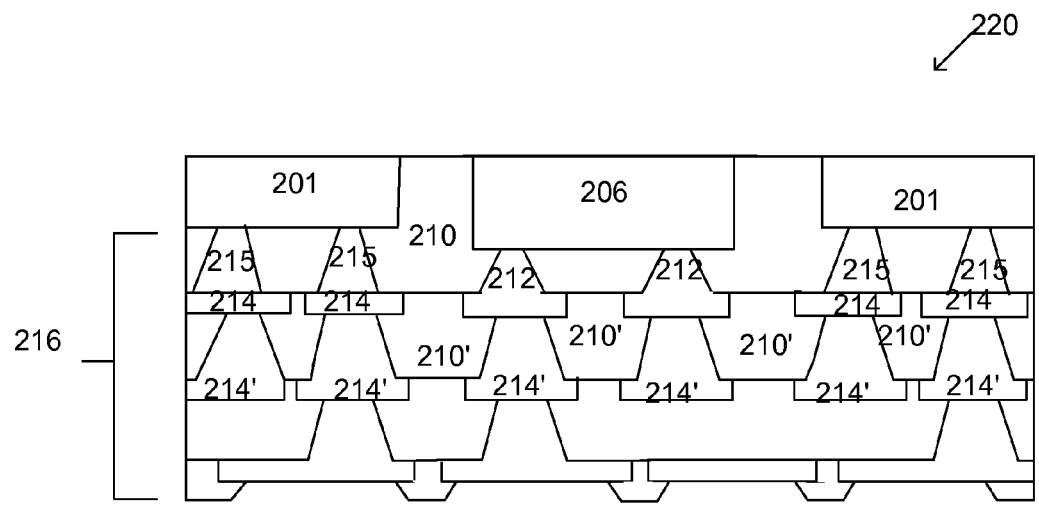

Subsequent layers may then be formed using standard substrate SAP build-up methods to form the remainder of the package 220, wherein further dielectric layers 210' and metallization layers 214' may be formed upon each other to form a coreless substrate portion 216 of a coreless package structure 220 by utilizing the buildup process (FIG. 2*b*). In an embodiment, the coreless package structure 220 may comprise a BBUL coreless package structure 220. In an embodiment, the top layer of the carrier material 200 and etch stop layer 202 may be removed (FIG. 2*c*). The bottom layer 200' may then be patterned to form an inductor structure 201. In an embodiment, a dry film may be laminated on the bottom carrier material layer 200 and subtractive patterning may be done to form the inductor structure 201. Additional chemical treatment or overmolding of epoxy materials may be done to protect the inductor structures 201 from mechanical and environmental damage, in some cases.

Figure 2D:
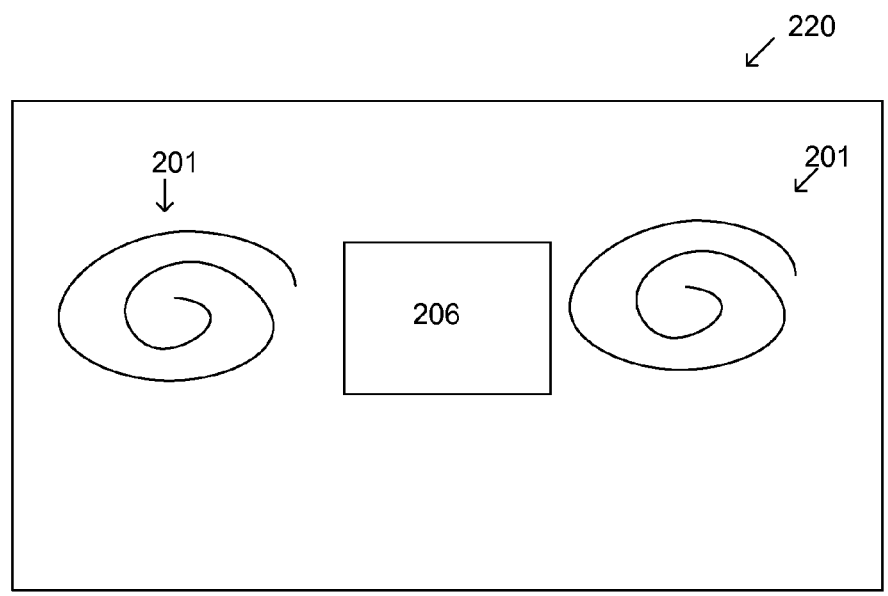
Figure 2E:
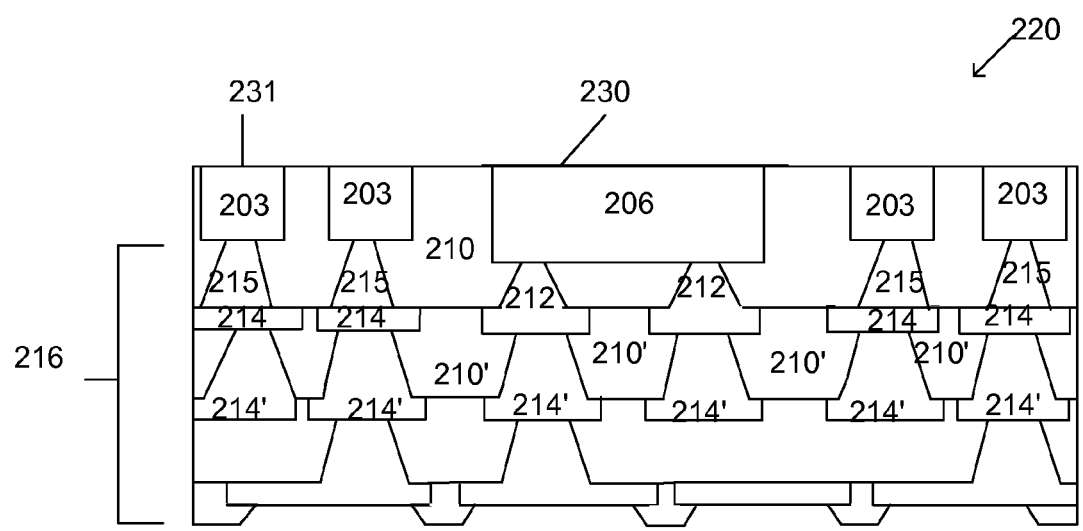

FIG. 2*d* depicts a top view of a spiral inductor structure 201 shown on either side of the die 206 with vias underneath start and finish point to connect them electrically into the package 220 (vias not shown). In another embodiment, after the top layer of the carrier material 200 and the etch stop layer 202 are removed, the carrier material bottom layer 200' may be patterned to form PoP (Package on Package) land structures 203 adjacent the die 206 (FIG. 2*e*). In an embodiment, a dry film may be laminated on the top layer of the carrier material 200' and subtractive patterning may be performed to form the POP structures 203.

Additional processing may be done to form the desired surface finish on top of the PoP structures 203, in some cases. An advantage of the present embodiment is that a top surface 231 of the POP pads 203 are flush/coplanar with a top surface (backside) 230 of the die 206, which provides for improved Z-height and ability to attach another package to the coreless package structure 220.

Figure 3:
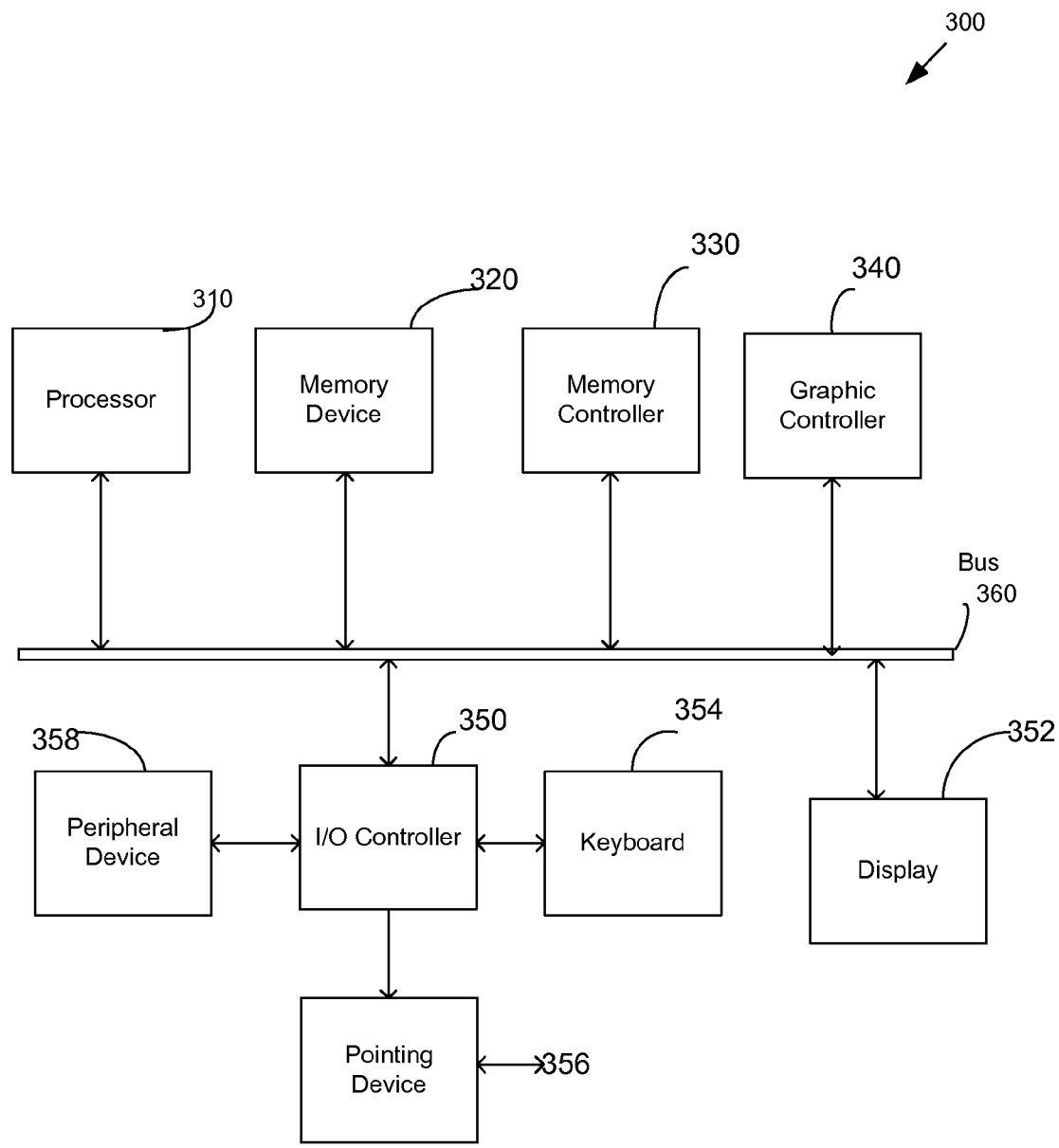
FIG. 3 represents a system according to an embodiment of the present invention.

FIG. 3 shows a computer system according to an embodiment of the invention. System 300 includes a processor 310, a memory device 320, a memory controller 330, a graphics controller 340, an input and output (I/O) controller 350, a display 352, a keyboard 354, a pointing device 356, and a peripheral device 358, all of which may be communicatively coupled to each other through a bus 360, in some embodiments. Processor 310 may be a general purpose processor or an application specific integrated circuit (ASIC). I/O controller 350 may include a communication module for wired or wireless communication. Memory device 320 may be a dynamic random access memory (DRAM) device, a static random access memory (SRAM) device, a flash memory device, or a combination of these memory devices. Thus, in some embodiments, memory device 320 in system 300 does not have to include a DRAM device.

One or more of the components shown in system 300 may be included in/and or may include one or more integrated circuit packages, such as the package structures including the functionalized carrier material of FIGS. 1h, 2c and 2e for example. For example, processor 310, or memory device 320, or at least a portion of I/O controller 350, or a combination of these components may be included in an integrated circuit package that includes at least one embodiment of a structure, such as the various functionalized carrier material structures presented herein, described in the various embodiments.

These elements perform their conventional functions well known in the art. In particular, memory device 320 may be used in some cases to provide long-term storage for the executable instructions for a method for forming packaged structures in accordance with embodiments of the present invention, and in other embodiments may be used to store on a shorter term basis the executable instructions of a method for forming package structures in accordance with embodiments of the present invention during execution by processor 310. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, memory device 320 may supply the processor 310 with the executable instructions for execution.

System 300 may include computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Benefits of the embodiments enable a new packaging architecture that can meet design requirements for future mobile/handheld system on a chip (SoC) processors at roughly half the cost of current package architectures. Various embodiments enable the addition of warpage improvement stiffeners, EMI shielding, inductor structures, PoP land structures and heat spreader structures without added post-package manufacturing cost. The POP land structures of the various embodiments have the added benefit of being formed without the need for an interposer to account for the die thickness in the package.

Prior art process flows for coreless BBUL packages typically involve building of the substrate on a temporary core/carrier capped with copper foil, which is etched off after the package is separated from the core. The embodiments herein include methods to functionalize the carrier material/copper foil on the carrier for uses such as heat spreaders, warpage improvement, electromagnetic interference (EMI) shielding for RF components, creating pads for Package on Package (POP) applications etc. thus reducing cost and increasing throughput.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that various microelectronic structures, such as package structures, are well known in the art. Therefore, the Figures provided herein illustrate only portions of an exemplary microelectronic device that pertains to the practice of the present invention. Thus the present invention is not limited to the structures described herein.

What is claimed is:

1. A method comprising;
    forming a cavity in a carrier material, wherein the carrier material comprises a top layer and a bottom layer separated by an etch stop layer;
    attaching a die in the cavity;
    forming a dielectric material adjacent the die and on the carrier material bottom layer;
    forming a coreless substrate by building up layers on the dielectric material; and
    removing the carrier material top layer and etch stop layer from the bottom layer of the carrier material.

2. The method of claim 1 further comprising wherein the bottom layer of the carrier material remains attached to the coreless substrate.

3. The method of claim 2 further comprising wherein the bottom layer of the carrier material comprises at least one of a heat spreader, an EMI shield structure, and a stiffener.

4. The method of claim 3 further comprising wherein the stiffener comprises a copper ring around the die.

5. The method of claim 1 further comprising removing the carrier material top layer and etch stop layer while they are disposed on the coreless substrate.

6. The method of claim 4 further comprising wherein the stiffener is attached to the substrate with no adhesive.

7. The method of claim 1 further comprising wherein the carrier material comprises copper.

8. The method of claim 1 further comprising wherein the coreless substrate comprises a portion of a coreless, bumpless, build up layer package.

9. A structure comprising:
    a die embedded in a coreless substrate;
    the coreless substrate including a dielectric material adjacent the die;
    die pad interconnect structures disposed in a die pad area of the die; and
    at least one functionalized carrier structure disposed within the coreless substrate, wherein a top surface of the at least one functionalized carrier structure is coplanar with a top surface of the coreless substrate and a back side of the microelectronic die.

10. The structure of claim 9 wherein the at least one functionalized structure comprises a copper material.

11. The structure of claim 9 wherein the coreless substrate comprises a portion of a coreless bumpless buildup package structure.

12. The structure of claim 9 wherein the at least one functionalized carrier structure comprises at least one of a stiffener, a heat spreader and an EMI shield.

13. The structure of claim 9 wherein the functionalized carrier structure is attached to the coreless package without an adhesive.

14. The structure of claim 13 wherein functionalized carrier structure comprises copper.

15. The structure of claim 11 wherein the die is fully embedded in the coreless substrate.

* * * * *

UNITED STATES PATENT AND TRADEMARK OFFICE
CERTIFICATE OF CORRECTION

PATENT NO. : 8,618,652 B2  
APPLICATION NO. : 12/761782  
DATED : December 31, 2013  
INVENTOR(S) : Ravi K Nalla et al.

Page 1 of 1

It is certified that error appears in the above-identified patent and that said Letters Patent is hereby corrected as shown below:

In the Claims

In column 6, line 51, in claim 10, delete "structure" and insert -- carrier structure --, therefor.

In column 6, line 61, in claim 14, delete "wherein" and insert -- wherein the --, therefor.

Signed and Sealed this
Twenty-fifth Day of March, 2014

Michelle K. Lee
*Deputy Director of the United States Patent and Trademark Office*